US008061077B2

(12) United States Patent
Roccaforte

(10) Patent No.: US 8,061,077 B2
(45) Date of Patent: Nov. 22, 2011

(54) COVER ELEMENT FOR GREENHOUSES OR THE LIKE

(76) Inventor: Giacomo Roccaforte, Ceriale (IT)

( * ) Notice: Subject to any disclaimer, the term of this patent is extended or adjusted under 35 U.S.C. 154(b) by 187 days.

(21) Appl. No.: 12/441,392

(22) PCT Filed: Nov. 13, 2007

(86) PCT No.: PCT/EP2007/062250
§ 371 (c)(1),
(2), (4) Date: May 9, 2009

(87) PCT Pub. No.: WO2008/058950
PCT Pub. Date: May 22, 2008

(65) Prior Publication Data
US 2010/0005712 A1  Jan. 14, 2010

(30) Foreign Application Priority Data
Nov. 17, 2006  (IT) .............................. SV2006A0031

(51) Int. Cl.
*A01G 9/24*  (2006.01)
(52) U.S. Cl. ................ 47/17; 47/29.1; 47/29.4; 47/29.5
(58) Field of Classification Search ............. 47/17, 20.1, 47/29.1, 29.2, 29.3, 29.4, 29.5, 29.7; 52/173.3; 136/246
See application file for complete search history.

(56) References Cited

U.S. PATENT DOCUMENTS

| | | | | |
|---|---|---|---|---|
| 3,741,631 A * | 6/1973 | Laing | ............................. | 359/228 |
| 4,198,953 A * | 4/1980 | Power | ............................ | 126/617 |
| 4,323,052 A * | 4/1982 | Stark | .............................. | 126/571 |
| 4,373,308 A * | 2/1983 | Whittaker | ..................... | 52/173.3 |
| 4,511,755 A * | 4/1985 | Mori | .............................. | 136/246 |
| 5,261,184 A * | 11/1993 | Appeldorn et al. | ............... | 47/17 |
| 5,303,525 A * | 4/1994 | Magee | ............................. | 52/306 |
| 6,057,504 A * | 5/2000 | Izumi | ............................ | 136/246 |
| 6,630,622 B2 * | 10/2003 | Konold | ......................... | 136/246 |
| 6,700,055 B2 * | 3/2004 | Barone | ......................... | 136/246 |
| 7,227,077 B2 | 6/2007 | Kleinwachter | | |
| 2001/0054252 A1* | 12/2001 | Kleinwachter | ................... | 47/17 |
| 2005/0081909 A1* | 4/2005 | Paull | ............................ | 136/246 |
| 2006/0054211 A1* | 3/2006 | Meyers | ......................... | 136/246 |
| 2006/0249198 A1* | 11/2006 | Rhee | ............................ | 136/246 |
| 2009/0158647 A1* | 6/2009 | Kleinwaechter | .................. | 47/17 |

(Continued)

FOREIGN PATENT DOCUMENTS

DE  4437362  12/1995

(Continued)

OTHER PUBLICATIONS

PCT, International Preliminary Report on Patentability, May 19, 2009.

*Primary Examiner* — Rob Swiatek
*Assistant Examiner* — Lisa Tsang
(74) *Attorney, Agent, or Firm* — Katten Muchin Rosenman LLP

(57) ABSTRACT

A cover element for greenhouses or the like is formed as a panel-like element that includes a first substantially transparent layer having alternate strips with optical means for deviating and concentrating light that are alternated with optically neutral strips, and a second partially opaque layer having optically neutral and substantially transparent strips that are alternated with opaque strips and that include a photovoltaic element.

18 Claims, 5 Drawing Sheets

U.S. PATENT DOCUMENTS

| | | | |
|---|---|---|---|
| 2010/0037935 A1* | 2/2010 | Vaid et al. | 136/246 |
| 2010/0126556 A1* | 5/2010 | Benitez et al. | 136/246 |
| 2010/0236164 A1* | 9/2010 | Chuang et al. | 52/173.3 |
| 2011/0016779 A1* | 1/2011 | Hermans et al. | 47/17 |
| 2011/0023939 A1* | 2/2011 | Chen et al. | 136/246 |

FOREIGN PATENT DOCUMENTS

| | | |
|---|---|---|
| FR | 2888046 | 1/2007 |
| WO | 0020805 | 4/2000 |

* cited by examiner

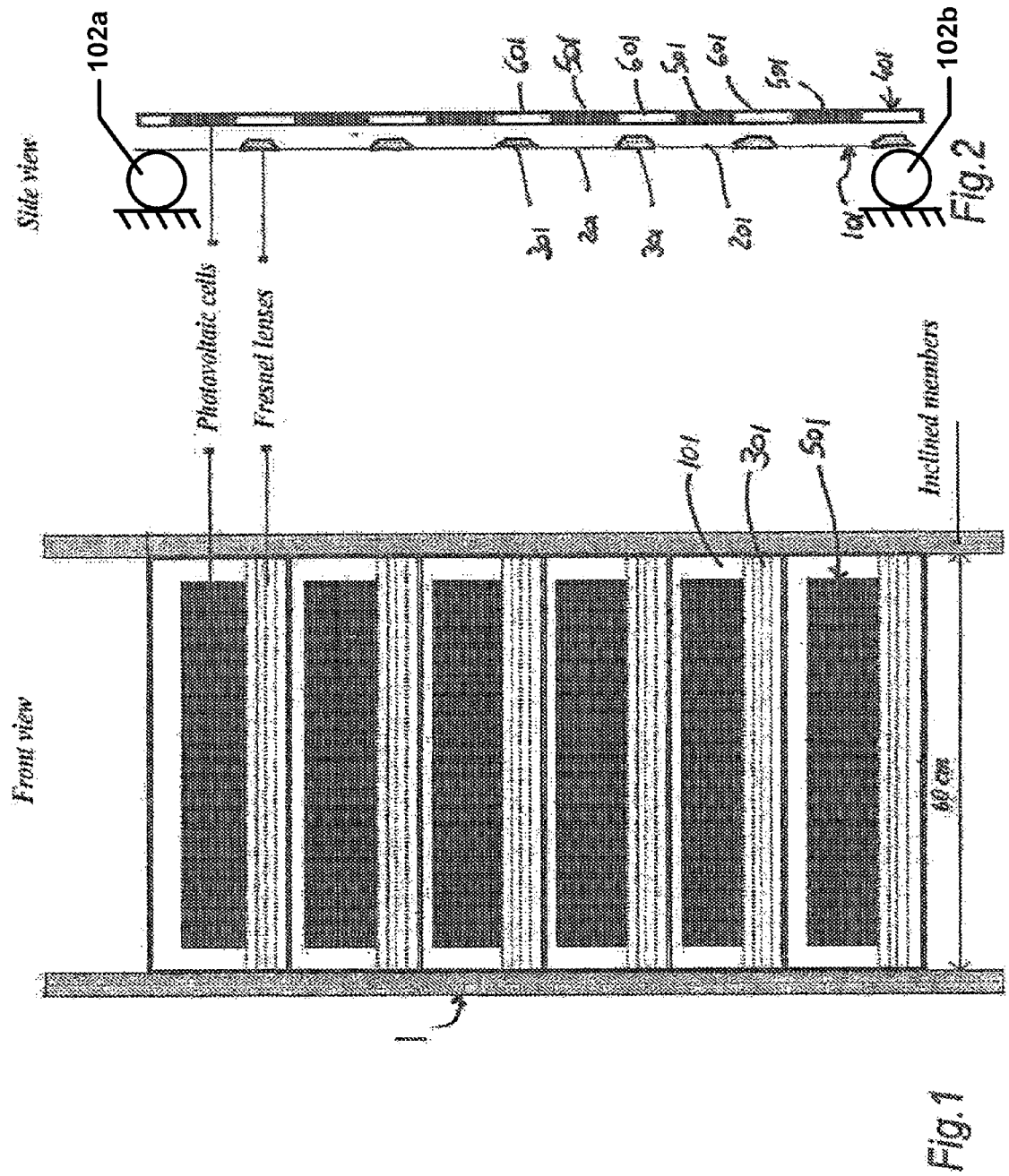

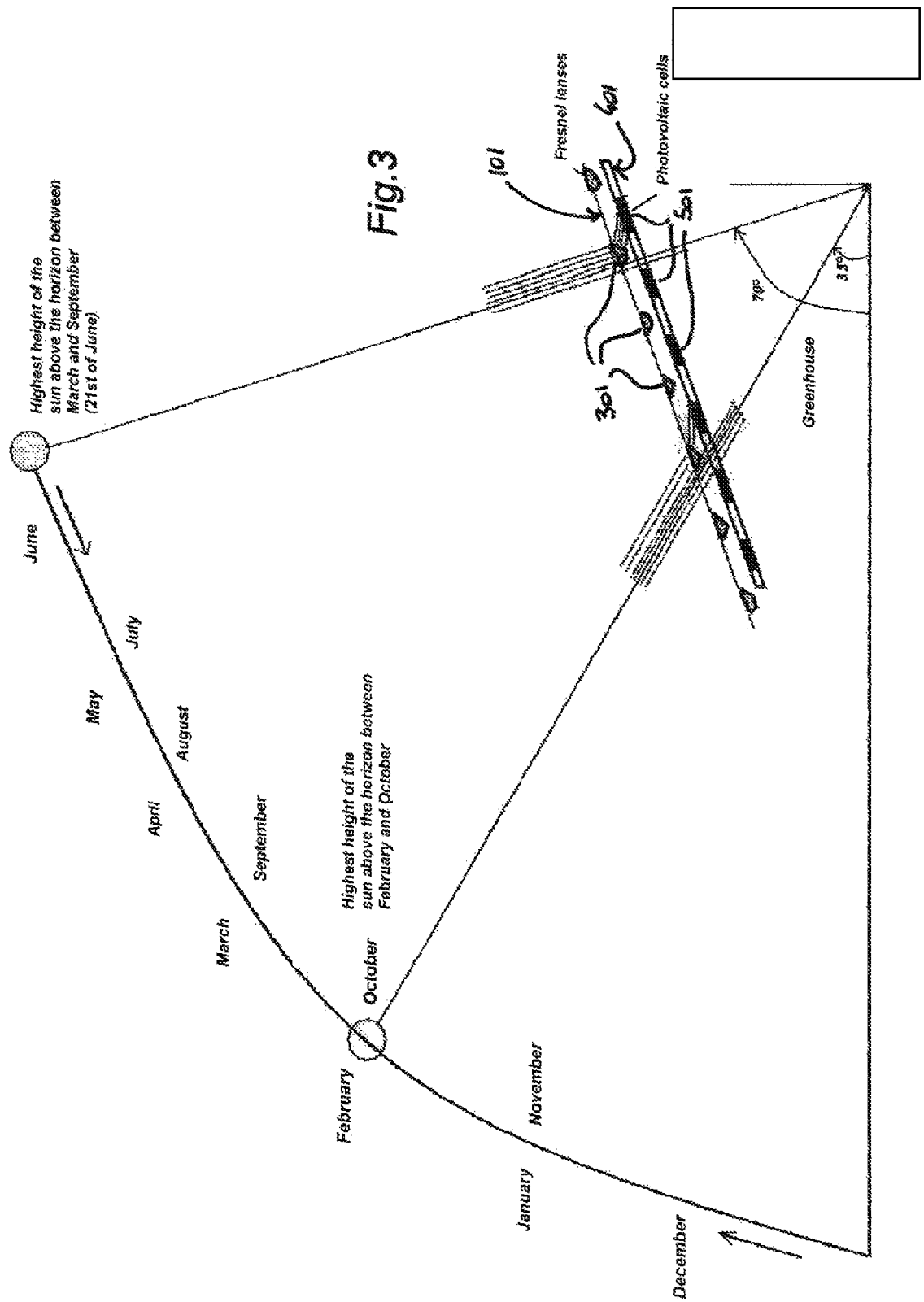

COVER ELEMENT FOR GREENHOUSES OR THE LIKE

FIELD OF THE INVENTION

The present invention relates to a cover element for greenhouses or the like. More particularly, the present invention relates to a cover element for greenhouses or the like that is formed as a panel-like element and that includes a first substantially transparent layer having strips with optical means that deviate and concentrate light and that are alternated with optically neutral strips, and a second partially opaque layer having optically neutral and substantially transparent strips that are alternated with opaque strips.

BACKGROUND OF THE INVENTION

Elements of such type are known and widely used. Although such elements solve their function in a satisfactory way, they have some drawbacks.

Cover elements for greenhouses can be provided as a cover panel arranged on or constituting the greenhouse roof.

As it is known, greenhouse roofs are generally composed of two inclined pitches formed by aligning transparent panels, generally made of glass, supported by a plurality of horizontal members and inclined members. During the summer greenhouses are usually covered by special nets and/or painted to limit light penetrating therein, thereby preventing overheating. This involves an increase of material and labor costs.

Covering the greenhouse with such prior art devices causes the sunlight to be reflected, preventing sunlight from entering and overheating the greenhouse.

SUMMARY OF THE INVENTION

A first aim of the present invention is to obviate the above described drawback and to provide, using simple and inexpensive means, a cover element of the type described hereinbefore. The inventive cover element provides for an automatic heat control of greenhouses as a function of solar radiation changes not only during various periods of the year, but also within a single day.

In other words, a substantially constant temperature is desired in the greenhouse, or anyway a temperature with changes that crops can withstand, while avoiding the use of various covers currently in use, mechanical moving parts and especially of human assistance, therefore with a considerable reduction of the overall greenhouse management costs.

A further aim of the present invention is to use the solar energy not employed for heating the greenhouse, barn or growing environment of crops. Essentially, instead of simply intercepting the sunlight through shielding panels, the greenhouse can be shielded against solar radiation, re-using the amount of solar energy that is not necessary for heating the greenhouse.

The invention fulfils the above aims by providing a cover element that includes a panel-like element having:
  (a) at least a first substantially transparent layer that includes alternate strips having at least an optical means for deviating and concentrating light alternated with optically neutral strips;
  (b) at least a second partially opaque layer that includes alternate strips having optically neutral and substantially transparent strips alternated with opaque strips and composed of at least a photovoltaic element, and
  (c) said first and said second layer being overlapped one over the other such that opaque strips composed of at least a photovoltaic element of the second layer are overlapped to optically neutral strips of the first layer.

The distance of the two layers, the widths of the opaque and optically neutral strips, i.e. transparent strips, of the second layer, the width of the optical means for deviating and concentrating light, and of the optically neutral strips that is alternated with the optical means are dimensioned so that the amount of solar light transmitted through the two layers into the greenhouse, and the amount of solar light falling on the opaque strips changes as a function of the angle of incidence of the solar light. Thus, when the sun is at its highest position above the horizon, a predetermined small amount of light passes through the two layers and inside the greenhouse while the remaining large amount of light is deviated by the optical means for deviating and concentrating light on the photovoltaic element. When the sun is at its lowest position above the horizon, a predetermined large amount of light passes through the panel, i.e. the two layers, and reaches inside the greenhouse while the remaining small amount of light is deviated by the optical means for deviating and concentrating the light on the photovoltaic element.

The meaning of "small" and "large" amount is clear within the context of the present description, since it indicates a bigger or smaller ratio of the total energy impinging on the panels or layers. The panels or layers can form a part of a greenhouse roof, or the entire greenhouse roof can be formed by the panels.

Thus, by modifying the ratio of the energy passing through, i.e. transmitted, by the two layers of the panels and of the energy deviated/concentrated on the opaque strips, it is possible to maximize energy transfer through the layers of the panels and into the greenhouse when the angle of incidence of the solar light is small. It is also possible to minimize energy transfer through the layers of the panels and into the greenhouse when the angle of incidence of the solar light is large. At the same time, the energy impinging on the solar cells forming the opaque strips is optimized.

During the year, it is not necessary to use all solar energy that can be collected in order to heat the greenhouse. Therefore, as mentioned above, during specific periods of the year the greenhouse has to be at least partially protected. By using an element according to the present invention, a part of the total amount of solar energy impinging on the greenhouse or the cover element of the greenhouse passes inside the greenhouse through the panels forming the cover element, while another part and particularly the remaining part of the total amount of the solar energy is deviated onto photovoltaic cells and used for generating electric energy, which can be re-used or stored to be used subsequently.

As is known, the sun rises in the east and falls in the west, forming an arc whose greatest height from the horizon is at a minimum during the winter solstice. The height of the arc progressively increases until the summer solstice and decreases again toward the winter solstice.

Different embodiments of the present invention are possible.

The transparent areas and the opaque areas may alternate with one another in a predetermined regular or irregular pattern. The pattern of opaque and transparent areas substantially depends on the latitude of the roof site, on the inclination of the pitch of the roof facing the south, and on pitch orientation with respect to the east-west axis. Special optical means may be provided, at each pair of areas consisting of one opaque area and one adjacent transparent area, for deviating and concentrating light alternately on the opaque area and the transparent area.

As mentioned above, the cover element according to the present invention may be installed on the roof of a greenhouse. In this case, the transparent areas and opaque areas may be arranged in such a pattern that at least one partition line between the opaque area and the transparent area of each pair of areas consisting of one opaque area and one adjacent transparent area is inclined with respect to the ridge of the roof to an extent substantially corresponding to the deviatione.g., with respect to the angle of the ridge from the east-west axis or direction. Therefore, thanks to this arrangement, this partition line is oriented substantially along the east-west axis as desired.

The opaque areas and the transparent areas cover either equal or different areas and this substantially depends on the latitude of the site, on which the cover element is placed.

The optical means for deviating and concentrating light may be a condenser lens. Any type of condenser lenses may be used, provided that they provide the light deviating effect required for operation. Configurations of such lenses particularly include plan convex lenses, double-convex lenses and even Fresnel lenses. The condenser lens is placed at a predetermined distance from the outer face of the first rigid panel.

The curvature of the lens is calibrated in such a manner as to deviate and concentrate light on the opaque area when the sun is at its highest position above the horizon, i.e. in the middle of the day, and at the time of year near the summer solstice, in which the solar radiation has a steeper inclination. Then, the curvature of the lens progressively deviates and concentrates light on the transparent area when the sun is at its lowest position above the horizon, i.e. in the morning and in the afternoon and at the time of year near the winter solstice. This maximizes light penetration into the greenhouse.

The axis of the lens may be oriented parallel to the longitudinal extension of the underlying strips, that is, assuming an ideal position of the roof or cover element substantially along the east-west axis or direction. The curvature of the lens and its distance from the first panel will be determined in such a manner as to optimize the desired effect of alternate deviation of solar radiation on the opaque area and on the transparent area.

According to an advantageous improvement, each condenser lens may be replaced by an equivalent echelon lens, known better as Fresnel condenser lens. As is known, this particular lens is a highly compact and light condenser whose concentric circles, which are cut in such a manner that each is a section of a convex surface, provide the effect of a conventional condenser lens, the latter having a much higher thickness and weight. Assuming equal performances, in particular equal optical performance, an equivalent Fresnel lens is relatively thin and light. This provides lower manufacturing costs, a smaller amount of material in use and thence a reduced overall weight of the cover element, and a smaller amount of light absorbed by the lens.

The cover element may be directly integrated within the roof of a greenhouse. In this case, the first panel may advantageously consist of one of the cover panels of the greenhouse roof, which affords considerable savings in the manufacturing costs of the cover element according to the present invention. Particularly, the novel cover element may be formed by adapting an existing greenhouse roof, i.e. by applying the opaque areas and the panels provided with lenses to the glass panels of any traditional greenhouse roof.

The advantages of the invention with the features described heretofore are apparent from the above description, and consist in a wholly automatic control of solar radiation in the greenhouse preventing any excessive heat changes therein. The need to use summer covers having light shading functions is also avoided. Furthermore, the cover element according to the present invention may be useful in protecting the greenhouse roof, particularly against particularly rough weather conditions such as hail or the like.

Additional advantages are that a cover element constructed according to the principles of the present invention allows the use of already existing large structures, the continuing use of the ground below the installation, and an automatically generation of electric energy, which may be used for agricultural purposes.

Moreover, by means of a cover element according to the present invention, the greenhouse can be automatically controlled as regards light and heat depending on the season, without using monitoring systems and moving parts.

The cover element according to the present invention has been disclosed with reference to a greenhouse cover, but may be also advantageously used for covering buildings or environments of any kind or purpose, such as verandas, skylights, sports facilities, or the like.

Another advantage of a cover element according to present invention is that the two layers are supported overlapped one over the other and are displaceable one with respect to the other relative to the distance of the two layers and/or to a direction, which is parallel to the layers and transverse or perpendicular to the longitudinal axis of the transparent and opaque strips. Therein, the first layer is a substantially transparent layer that includes alternate strips having at least optical means for deviating and concentrating light alternated with optically neutral strips, and the second, partially opaque layer includes alternate strips having optically neutral and substantially transparent strips alternated with opaque strips, which may include a photovoltaic element.

In on embodiment, instead of providing layers which can displaced relatively one to the other as integral parts, a construction may be provides such that, for only one layer or for both layers, each strip or at least some strips can be displaced independently from the other strips of that layer.

The advantage of a displaceable support of the layers lies in the possible optimization for use at a specific latitude and/or with a specific orientation relatively to the east-west axis.

A preferred embodiment of the invention provides for the two layers to be placed in a relative position one with respect to the other such that for low or decreasing incidence angles of the solar light, such as at dawn, at sunset or in winter-time, or at higher latitudes, the solar light falling onto the panels passes partly directly trough the transparent strips of the second layer, and for the remaining part is deviated by the optically active strips of the first layer onto the transparent strips of the second layer, while for increasing or high incidence angles of the solar light on the panels the solar light falls partly directly onto the opaque strips of the second layers. This maximizes the ratio of the solar light passing through the panel relative to the solar light falling onto the opaque strips, while the remaining part of the solar light is deviated by the optically active strips from the transparent strips to the opaque strips. In turn, this maximizes the ratio of solar light falling onto the opaque strips with respect to the solar light passing through the panels, i.e. the transparent strips of the second layer.

The above effects can be achieved, for example, by providing for the optical active strips, possibly formed by Fresnel lenses, to be provided overlapped to the lower part of a corresponding transparent strip. Specifically, the overlap occurs at the part of a transparent strip adjacent to the adjacent lower opaque strip referred to the inclination of the panel forming a roof.

According to another preferred embodiment, the optically active strips are formed by lenses, and particularly the optically active strips are formed by the edge part of a cylindrical lens.

Other features and improvements will form the subject of the dependent claims.

BRIEF DESCRIPTION OF THE DRAWINGS

The features of the invention and advantages derived therefrom will be more apparent from the following detailed description of the annexed drawings, in which:

FIG. 1 is a plan view of an element according to the present invention;

FIG. 2 is a section view of an element according to the present invention;

FIG. 3 is a diagram of an the element according to the present invention operates;

DETAILED DESCRIPTION OF EMBODIMENTS OF THE INVENTION

Figure 4:
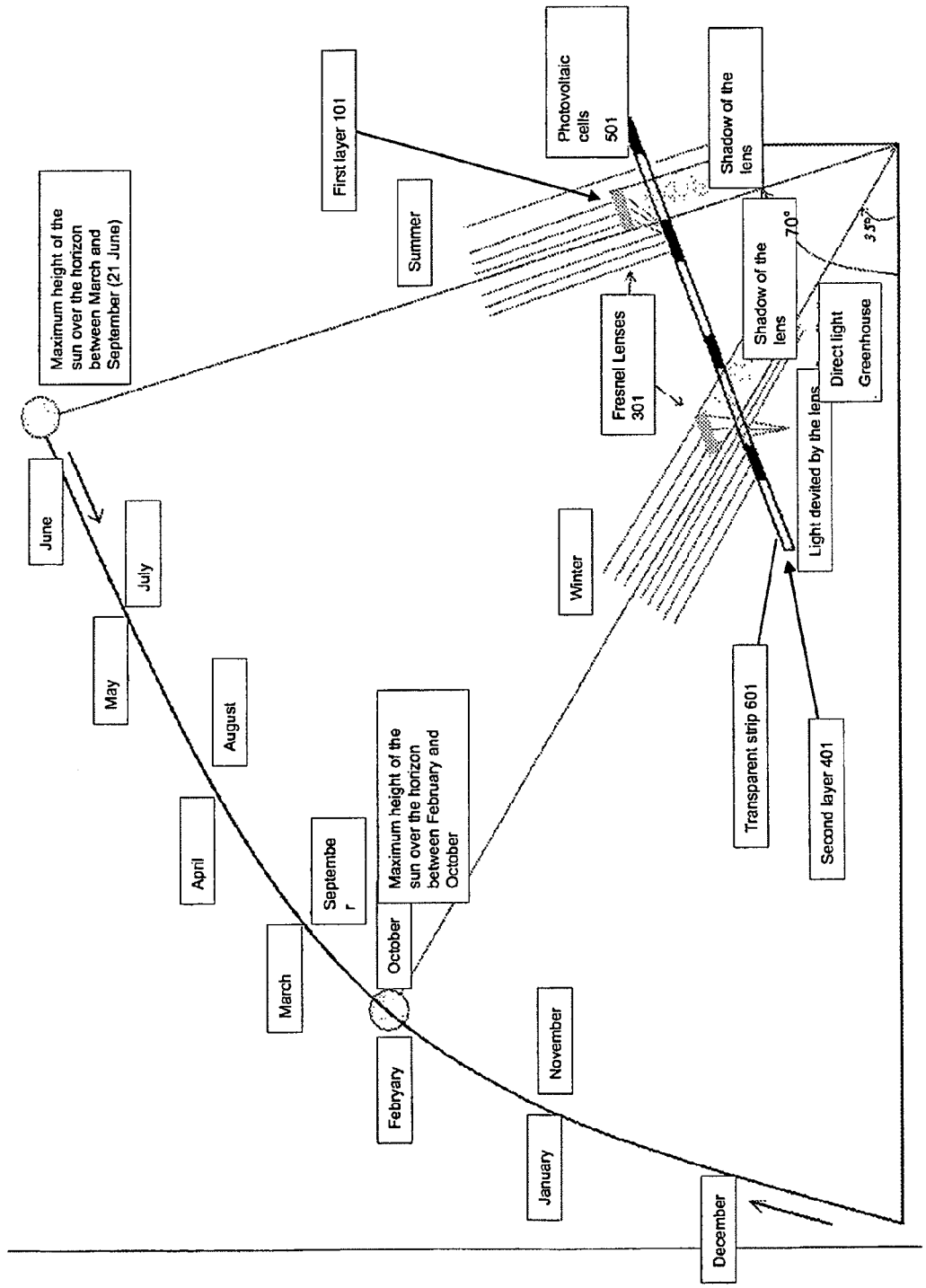
FIG. 4 illustrates, similarly to FIG. 3, a different embodiment of the present invention.

With reference to FIGS. 1 and 2, an advantageous embodiment of the cover element for greenhouses or the like according to the present invention comprises at least a panel-like element 1 providing: at least a first substantially transparent layer 101 comprising alternate strips having at least optical means 301 for deviating and concentrating light, which is alternated with optically neutral strips 201, and at least a second partially opaque layer 401 comprising alternate strips having optically neutral and substantially transparent strips 601 alternated with opaque strips and composed of at least a photovoltaic element 501.

In FIG. 2 it can be noted that the first layer 101 and the second layer 401 are overlapped one with the other in such a way that opaque strips composed of at least a photovoltaic element 501 of the second layer 401 are overlapped to the optically neutral strips 201 of the first layer.

When the sun is at its highest position above the horizon, a predetermined small amount of light passes through the panel 1 and the remaining large amount of light is deviated by the optical means 301 for deviating and concentrating light on the photovoltaic element 501. When the sun is at its lowest position above the horizon, a predetermined large amount of light passes through the panel 1 and the remaining small amount of light is deviated by the optical means 301 for deviating and concentrating the light on the photovoltaic element 501.

The operation of the panel-like element 1 can be better understood with reference to FIG. 3.

The element 1 in the preferred embodiment is made of alternate rows of photovoltaic elements 501 or photovoltaic cells that are arranged strip-like.

In the preferred embodiment, photovoltaic cells cover about 50% of the element surface, but such photovoltaic cells can cover from 40% to 70% of the element surface. The remaining part is completely transparent for solar radiation, which, therefore, can be transmitted into the underlying greenhouse.

In the upper part, a series of suitably spaced optical lenses 301 for each strip of photovoltaic cells is applied at gaps between rows of photovoltaic cells.

The sunlight can enter directly the greenhouse, by means of the gap between optical lenses and photovoltaic cells, including when the sun is below a specific height with respect to the horizon.

On the contrary, the light impinging on lenses 301 is deviated by the lens towards photovoltaic cells 501.

Sun height, and therefore the season, may be predetermined, and the related sun radiation that would pass the gap of the panel will be intercepted by the lens and be deviated on the photovoltaic cell 501 by changing the distance between the lens 301 and the cell 501, that is, between the first and the second layers 101 and 401.

Therefore, the moment of the year may be determined when light shading needs to be increased, corresponding to an increase in the brightness on cells 501 and so on the generation of electric energy.

Thus, with changing seasons, the amount of light entering the greenhouse also changes, causing an almost constant temperature and amount of light inside the greenhouse along all year.

The excess solar energy, during the summer and in the hottest hours of the day, is used for increasing the generation of electric energy, and it is not wasted or merely intercepted by nets or paints above the greenhouse as usually occurs in prior art systems.

As it can be noted in FIG. 3, during the winter (the examples of February and October are shown), the greatest portion of sun radiation impinging on the element passes through the element and enters the greenhouse, while during the summer (the example of June is shown) most of sun radiation is deviated on photovoltaic cells while the least amount of sun radiation passes through the panel and enters the greenhouse. The inclination of the sun with respect to the horizon is one element to be considered in deciding whether a larger or smaller amount of solar energy has to pass through by choosing, for instance, the type of lens or the distance of the first or second layers 101, 401.

An advantage of the present embodiment is that unlike systems of the prior art, the ground below the panels may continue to be used for cultivation purposes, thus considerably reducing the overall costs of the photovoltaic field both in economic and environmental terms, moreover a saving of about 35% in plant cost can be obtained by placing elements according to the present invention and by using a greenhouse frame.

Because of the large available surface, the considerable amount of generated energy may be employed for heating the greenhouse during the winter.

The generated electric energy may also be transmitted outside of the greenhouse over one or more wires.

A plurality of condenser lenses 301, such as cylindrical planoconvex or Fresnel lenses, are provided at a predetermined distance from the photovoltaic module 501.

The lenses 301 may be integrated in a single layer which may be for instance molded from transparent plastic material.

When the sun is in a relatively low position above the horizon, the lenses cause the sun light beam to pass on the transparent strips, and allow light to penetrate into the greenhouse to an extent substantially corresponding to a wholly transparent pitch. However, when the sun is in a relatively high position above the horizon, and sunlight might be excessive in the greenhouse, the lenses progressively deviate and concentrate the light beam on the rows of photovoltaic modules. This prevents an overheating in the greenhouse and allows the generation of electric energy to be used for any purpose.

In FIG. 4 a preferred embodiment of the present invention is illustrated. Therein, the width of the optically active strips, i.e. of the optical means 301 of the first layer, is only a part of the width of the transparent strips 601 of the second layer 401. In particular, the width of the optical means 301 is about half the width of the transparent strips 601 of the second layer 401. Furthermore, the optical means, i.e. the optically active strips, are overlapped over the lower part of the transparent strips 601 in relation to the inclination of the cover element or roof of the greenhouse, on which the cover elements are installed. Particularly, the lover longitudinal edge of each optical active strip 301 is coincident with the lower longitudinal edge of the transparent strip 601 over which the optical active strip 301 is overlapped. The term lower being refers to the inclination of the cover element or roof of the greenhouse on which the cover elements are installed.

The distance of the two layers 101 and 401, and particularly of the optically active strips 301 from the second layer 401, particularly from the transparent strips 601, and the deviation/concentration effect of the optically active strips 301, are such that with an increasing height of the sun over the horizon from a minimum height to a maximum height, the solar light incident on the optically active strips 301 is progressively deviated and also concentrated by the optically active strips 301 from the transparent strips 601 of the second layer 401 to the opaque strips 501 of the said second layer 401.

In particular, as it appears from FIG. 4, the above illustrated configuration of the cover element allows a certain amount of the incident solar light to pass through the two layers inside the greenhouse for every position of the sun, i.e. for every angle of incidence of the solar light. Part of the solar light incident onto the optically active strips 301 is alternatively deviated and partially also concentrated onto the transparent strip 601 or on the opaque strip 501 as a function of the angle of incidence of the solar light or of the height of the sun over the horizon.

As illustrated in FIG. 4, the above effect can be also explained by the fact that the optically active strips 301 generate a shadow that varies in position depending from the angle of incidence of the solar light, i.e. from the height of the sun over the horizon.

The configuration of FIG. 4 works in such a way that in winter time, i.e. when the angle of incidence of the solar light is low, the light passing through the transparent zones 601 between the opaque strips 501, i.e. the strips of photovoltaic cells, inside the greenhouse is the light passing between the optically active strips 301 and the associated strip 501 of photovoltaic cells (i.e. the strip directly adjacent on the lower side of each optically active strip 301) with the additional light deviated by the optical active strips 301 onto the coincident transparent strip 601.

The light deviated by the optically active strip 301 compensates the shadow generated by the optically active strip 301 in a position coinciding with the corresponding transparent strip 601. Accordingly, the total amount of light energy passing through the cover element is essentially the same as the amount which would have passed the cover element in absence of the optically active strips 301.

On the opaque strips 501, i.e. on the photovoltaic cells, the light incident is only the light directly falling onto the opaque strips 501. The effect of the present cover element is that in winter the amount of light energy passing the cover element and thus entering the greenhouse is the same as if the optically active strips were absent. This is valid also for the light energy falling onto the photovoltaic cells, so that no difference can be seen as compared to normal cover elements formed by simple alternated transparent and opaque strips 601, 501.

In summer, i.e. when the angle of incidence of the solar light is great or when the height of the sun over the horizon reaches high values, the light passing the cover element is only the one which falls between each of the optical active strips 301 and the opaque strip 501, i.e. the strip of photovoltaic cells which lies on the higher side of the optical active strip and of the coinciding transparent strip 601 of the second layer 401. The light falling on the optical active strips 301 is deviated and concentrated on each one of the opaque strip, i.e. on each strip of photovoltaic cells which lies besides the lower longitudinal edge of each of the optical active strips 301.

Thus, the optically active strip 301 generates a shadow zone on part of each of the coinciding transparent strips 601. In summer, the lack of light passing the cover element due to the shadow generated by the optically active strips 301 is not compensated, but the light falling on the optically active strips 301 is deviated on the strips of photovoltaic cells 501. Accordingly, in summer the light energy passing into the greenhouse is reduced while the light energy falling onto the photovoltaic cells is increased.

Thus, the shadowing of the greenhouse is enhanced, while the light energy prevented from penetrating into the greenhouse is used for generating electric energy.

In this case, the light energy falling onto the strips of photovoltaic cells 501 is the light energy falling directly onto the strips of photovoltaic cells 501 plus the light deviated and concentrated thereon by the optically active strips 301.

FIG. 4 is only an example, since the absolute or relative incidence angles indicated for winter and for summer are not always the same, because these angles depend from the latitude and from the orientation of the strips, and thus of the roof or of the cover elements of the greenhouse, and from the inclination of the roof or of the cover element relative to a horizontal plane.

It is important to note that in the absence of sun, the cover element produces electrical energy like any other photovoltaic panel according to the prior art.

In the prior art, photovoltaic panels, and particularly photovoltaic systems, concentrate light energy by means of big lenses on very small cells, rendering control systems for following the sun mandatory for optimizing the orientation of the panel relatively to the position of the sun. Instead, the cover element according to the present invention does not require any kind of control systems.

If the latitude is known and if the orientation of the cover element is known in relation to the west-east direction, and also if the inclination of the cover element is known in relation to a horizontal plane, the present invention does not require any displaceable part, and thus construction is less expensive and requires less service.

During spring, summer and fall, the cover element according to the present invention produces more energy than any other known photovoltaic panel, if the areas covered by photovoltaic cells are considered. In the absence of sun and in any season, the cover element according to the present invention produces electrical energy like any other photovoltaic panel according to the prior art if the areas covered by photovoltaic cells are considered.

The cover element is configured such that in winter the shadow generated by the optically active strips 301 does not reach the adjacent strips of photovoltaic cells 501, thus avoiding a reduction in the production of electric energy, while in summer the complete amount of solar light falling onto the optically active strips 301 is deviated on the strips of photovoltaic cells 501.

In order to achieve the above configuration, different parameters must be set, which are:

The dimensions of the optically active strips 301; and

The distances of the optically active strips 301 from the layer of alternated transparent and opaque strips 601, 501 on which the layer of optically active strips 301 is superimposed.

The position of the optically active strips 301 relative to the transparent and opaque strips 601, 501, this means the position relative to a direction perpendicular to the longitudinal axis of the strips.

Once the constructive parameters are defined, then the present cover element works automatically without the need of relative displacement of constructive parts thereof.

Nevertheless, if desired it is possible to provide means for supporting the optically active strips 301 relative to the transparent and to the opaque strips 601, 501 of the second layer.

The above displacement may consist in a displacement in the direction of the distance of the optically active strips 301 from the second layer, i.e. in the direction perpendicular to the surface of the strips 301, 601, 501 and/or a displacement in the direction transverse or perpendicular to the longitudinal axis of the strips 301, 601, 501.

The means for supporting in a displaceable way according to one or more directions the optically active strips 301 and/or the transparent strips 601 and/or the opaque strips 501 of the second layer can be of the kind, which allows a common displacement of all or of part of the optically active strips 301 of the first layer and/or a common displacement of at least part or of all of the transparent and opaque strips 601, 501 of the second layer.

A modified embodiment may provide supporting means of the optically active strips 301 and/or of the transparent strips 601 and/or of the opaque strips 501. The supporting means allows a displacement at least along one direction of one or more strips separately from the other strips of the optically active strips 301 and/or of the transparent and/or opaque strips 601, 501.

The above supporting means can be of any kind and can be formed by frames for supporting the strips, which are connected by means of extendible connecting elements to other frames supporting the other strips, such as, for example, telescopic arms or combinations of articulated levers, while the displacement may be caused by motorized means. The construction of the displaceable supporting means lie within the general knowledge of the skilled artisan.

The effect of allowing a relative displacement of the optically active strips 301 relative to the transparent or to the opaque strips 601, 501 or of all strips relative to one another is that the displacement provides for a variation of the features of the basic functions of the cover element by anticipating or delaying the moment, in which the light is deviated onto the transparent strips 601 or onto the opaque strips 501, i.e. onto the photovoltaic cells. This enables a correction of the behavior of the cover element, in order to adapt it to irregular weather conditions or to particular kinds of cultivation.

Figure 5A:
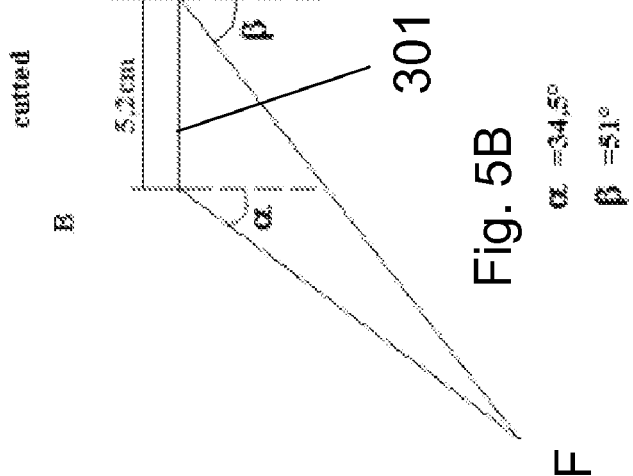
FIG. 5A illustrates the Fresnel lens equivalent to a cylindrical lens.
Figure 5B:
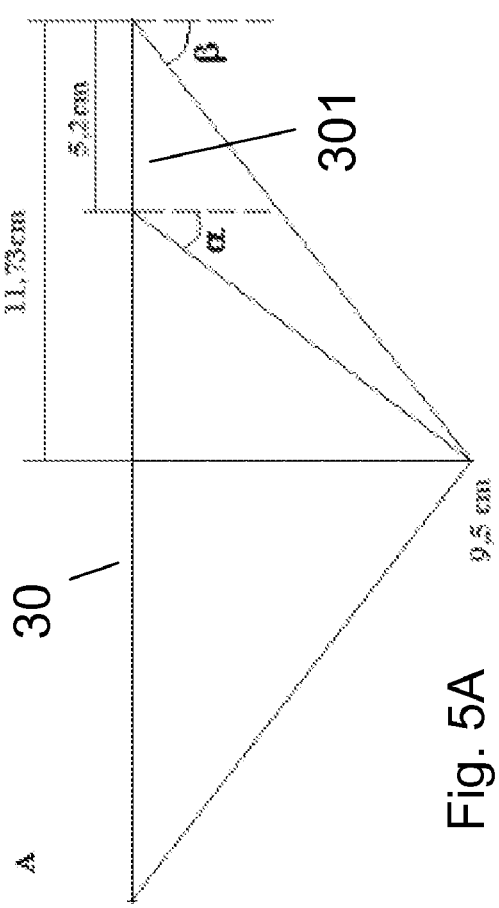
FIG. 5B illustrates the edge part of the Fresnel lens of FIG. 5A corresponding to the edge part of a cylindrical lens, which may be employed in an embodiment of the present invention.
Figure 5C:
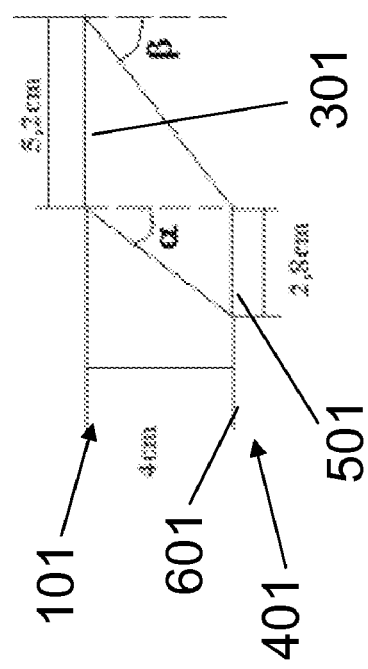
FIG. 5C illustrates a specific example of the optically active element of a first layer and a second layer at a predetermined distance, such to obtain at least a partial deviation of the solar light and also at least a partial concentration of the solar light on a reduced surface corresponding to the surface of the photovoltaic cells.

In the illustrated example, the optically active strips 301 are formed by lenses. Each optically active strip 301 is obtained from a cylindrical lens by using only a sector along the longitudinal edge. The example of FIG. 4 and FIGS. 5A to 5C is configured by considering the latitudes of north Italy. In this case, each optically active strip 301 is positioned at a distance of about 40 mm from the lower layer of alternated transparent and opaque strips 501, 601. In this case, during summer, when the sun is at the azimuth and approximately perpendicular to the lens, the entire light energy falling onto the lens is deviated onto the opaque strip 501 of photovoltaic cells. The light is not only deviated but also partly concentrated, so that the performance of the photovoltaic cells is increased. In the example of FIGS. 5A to 5C, the light falling onto the lens having a width of 52 mm is concentrated onto a strip a width of 28 mm.

Referring more particularly to the figures, FIG. 5A illustrates a cylindrical lens 30 having a radius of 117.3 mm, and the longitudinal edge sector 301 of the lens 30 has a width of 52 mm. Beta (.beta.) is the angle of the cone concentrating the light collected by the lens 30 onto the focal point at 95 mm from the lens 30. Alpha (.alpha.) is the angle of deviation of the light at the longitudinal edge, along which the longitudinal edge sector 301 is separate from the resting part of the cylindrical lens 30.

FIG. 5B illustrated the conditions of FIG. 5A relative only to the longitudinal edge sector 301 of the cylindrical lens 30.

FIG. 5C illustrates the plane, at which the alternate strips of transparent and opaque strips 501, 601 of the second layer are provided, which plane is at 40 mm distance from the plane, on which the longitudinal edge sector of the cylindrical lens 30 lies. The position of the opaque strip 501 is illustrated and the width of the zone on the opaque strip 501 is indicated, on which the light falling onto the longitudinal edge sector 301 of the cylindrical lens 30 is concentrated, which zone has a width of only 28 mm.

As already described with reference to the previous example of FIGS. 1 to 3, the lens 30 and thus the longitudinal edge sector 301 thereof can be substituted by an equivalent Fresnel lens.

Many variants of the present invention are possible. As regards photovoltaic cells, any kind of photovoltaic cell can be used such as crystalline or amorphous silicon cells or even cells made by thin films of a photovoltaic material.

The latter technique, although relatively expensive, allows generating any kind of pattern of opaque zones on the cover element and is particularly adapted to be used in combination with embodiments of the present invention using different patterns of opaque and transparent zones 501, 501 and of optically active zones 301 in the two superimposed layers forming the cover element.

Figure 6:
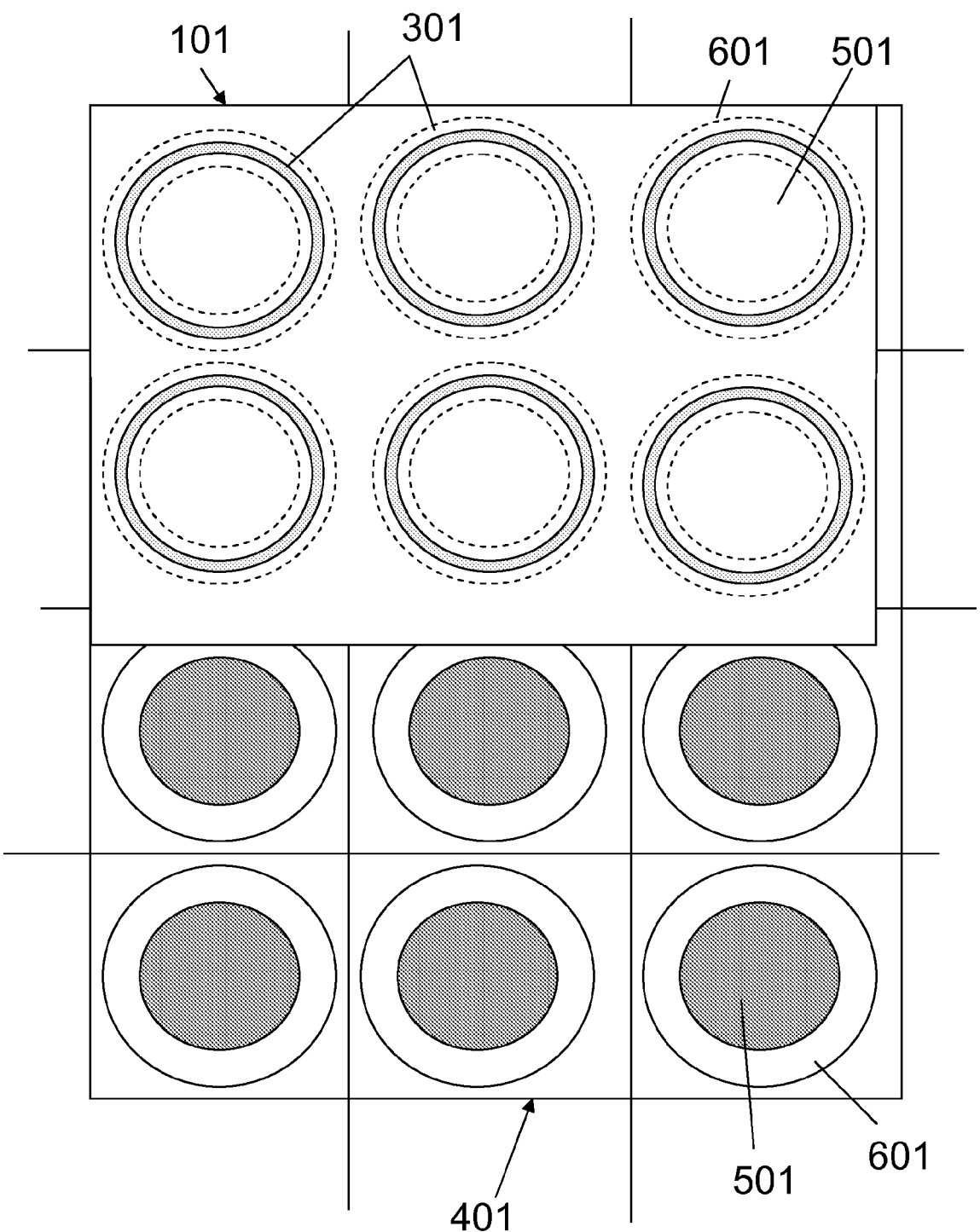
FIG. 6 illustrates another embodiment of the invention, in which the different optically active zones and transparent and opaque zones are distributed according to a different pattern than the alternated strips of the previous examples.

FIG. 6 illustrates a preferred example, which overcomes the problem of having to consider the orientation of the cover element relative to the east-west direction.

In this case, the pattern of the opaque zones 501 of the first layer consists in an array of circular opaque zones, which are at a predetermined equal distance one from another such that, for each circular opaque zone, an annular transparent 601 zone exist directly surrounding the circular opaque zone 501, while for each pair of circular opaque zone 501 and annular transparent zone 601 there is an optically active zone 301 provided coincidentally in a layer which is superimposed to the layer carrying the array of circular opaque zones 501 surrounded by annular transparent zones 601.

In this case, the optically active zones 301 can be annular active means such as lenses, each of which is positioned coincidentally with one of the annular transparent zones 601 surrounding the circular opaque zone 501.

Each set comprising one optically active zone 301, one opaque zone 501 and one transparent zone 601 has a rotational symmetry such that the set works always in the same manner independently of the orientation relative to the east-west direction.

The invention is not limited to the embodiments described and illustrated herein, but may be greatly varied, especially as regards construction. For example, advantages may be obtained from using Fresnel lenses instead of cylindrical planoconvex lenses, due to their lower weight with equal properties. The portion of the light deviated on the modules or the transparent strips 601 during the year may be controlled by adjusting the distance of the lenses from the photovoltaic modules.

Otherwise, in alternative to or in combination with the above, optical devices other than those described above, e.g. concave mirrors, may be used. Furthermore, the cover element of this invention may be advantageously used in combination with environments other than a greenhouse, such as for example verandas or the like. The above is without departing from the guiding principle disclosed above and claimed below.

Generally, the optical means 301 for deviating and concentrating light is a lens whose curvature is calibrated in such a manner as to deviate and concentrate light on the opaque area 501 when the sun is at its highest position above the horizon, and progressively deviate and concentrate light on the transparent area 601 when the sun is at its lowest position above the horizon.

Preferably, opaque strips 501 and transparent strips 601 are arranged as alternate strips, that is, without being overlapped one over the other in a plan view.

Condenser lenses are integrated in a substantially rigid layer integrally comprising said condenser lenses, said panel being placed at a predetermined distance from and in a direction parallel to the second layer and having the same size thereof. The second layer, in a preferred embodiment, is made of a rigid material, such as transparent glass or the like alternated with photovoltaic cells or modules, and the first layer is made of a rigid material as well, such as a transparent plastic material or the like.

Moreover, the first layer is fastened to mobile supports 102a and 102b and has moving means for bringing closer/spacing apart the first layer and the second layer.

A further advantage of the present invention is that the temperature of the greenhouse can be automatically controlled, without moving mechanical parts.

Panels may be installed on all greenhouse covers faced between south-east and south-west, appropriately adjusting the position of rows of lenses and cells.

If the ridge of the greenhouse is perfectly faced in the direction of south, the installation can be carried out on both sides of the roof. Once the system is calibrated for the type of crop and/or climate, adjustments can be made only for changing the type of crop and climate, and so will be made only occasionally.

This is important since, by not using sun tracking systems, which are energy consuming and need a greater maintenance, one of most important advantages of the invention are attained.

Moreover, a monitoring system may be installed that has the following tasks:

for a safety system:
  in case of malfunction of one or more component of the network, or if there is no communication between sensors and dimmers, a default action can be planned such as, for instance, turning off or reducing the power of heaters, or lenses can be placed at a certain predetermined height;
  the system could also send alarms if there are problems with the electric network, and for instance it could start other heating systems;
  sensors could also operate as anti-theft devices of panels and/or heaters, sending an alarm in the event of an action tampering or removing a component.

Briefly, the monitoring system may be a software or computer program loaded or loadable on a personal computer and may use the same communication hardware structure that is usually used by computers (hub, switch etc.) connected to various dimmers and step by step motors adjusting the height of panels, and may preferably be based on a TCP/IP and/or SNMP communication protocol.

The overall system could be monitored both locally, by connecting the supervisor PC directly to the network, and remotely by means of modem or internet. The above mentioned protocols make possible to do either of the above.

The invention claimed is:

1. A cover element for greenhouses comprising:
  a panel-like element comprising
    a first substantially transparent layer comprising,
      first-strips that have optical means for deviating and concentrating light, and
      second strips that are optically neutral strips and that are alternated with the first strips, and
    a second partially opaque layer comprising,
      third strips that are optically neutral and substantially transparent, and
      fourth strips that are opaque strips and that are alternated with the third strips, the fourth strips comprising photovoltaic elements,
  wherein said first and said second layer layers overlap one over the other such that the fourth strips are disposed under the second strips,
  wherein the distance between the first and the second layers, the widths of the first and the third strips, and of the second and the fourth strips, are dimensioned
    such that an amount of solar light transmitted through the first and the second layers and the amount of the solar light falling on the fourth strips is modified as a function of an angle of incidence of the solar light and
    such that, when the sun is at a highest position above the horizon, a predetermined amount of light passes through the first and the second layers while a remaining amount of light is deviated by said optical means on said photovoltaic elements, and when the sun is at a lowest position above the horizon, a predetermined amount of light passes through the panel while a remaining amount of light is deviated by said first strips, and
  wherein the remaining amount of light when the sun is at the highest position is larger than the remaining amount of light when the sun is at the lowest position.

2. The cover element according to claim 1, wherein said optical means comprises a condenser lens arranged on said first layer at a predetermined distance from said second layer.

3. The cover element according to claim 2, wherein said condenser lens is planoconvex or bi-convex, or is a Fresnel lens.

4. The cover element according to claim 2, wherein a curvature of the condenser lens is shaped to deviate and concentrate light on the fourth strips when the sun is at the highest position above the horizon, and to progressively deviate and concentrate light on the third strips as the sun moves to the lowest position above the horizon.

5. The cover element according to claim 2, wherein the condenser lens is provided as an edge sector of a cylindrical lens.

6. The cover element according to claim 2, wherein the third and fourth strips are arranged one alternated to the other.

7. The cover element according to claim 2, wherein the condenser lens is integral in a substantially rigid layer that provides the first layer, said first layer being placed at a predetermined distance from and in a direction parallel to said second layer and having the same size thereof.

8. The cover element according to claim 1, wherein said third strips comprise a rigid material that is alternated with the photovoltaic elements, and wherein said second strips comprise a rigid material.

9. The cover element according to claim 8, wherein the third strips comprise glass that is alternated with the fourth strips, and wherein the first layer comprises a transparent plastic material.

10. The cover element according to claim 1, wherein the cover element is placed at a predetermined inclination relative to the ground, wherein each first strip is overlapped over one of the third strips, each first strip having a width smaller than a width of the respective third strip, and wherein each first strip has an edge that is approximately longitudinally coincident with an edge of the respective third strip and of an adjacent fourth strip.

11. The cover element according to claim 10, wherein the width of the first strip is approximately one half of the width of the respective third strip.

12. The cover element according to claim 1,
wherein the second layer comprises an array of circular fourth strips comprising photovoltaic material, wherein each circular fourth strip is disposed at a distance from a neighboring circular fourth strip,
wherein the third strips are a plurality of annular transparent areas each surrounding a fourth strip, and
wherein the first layer is overlapped on the second layer and comprises the first strips each shaped to be superimposed to a set comprising said circular fourth strip and said annular third strip.

13. The cover element according to claim 12, wherein the first strips are in the form of circular lenses each superimposed to said set comprising said annular third strip and said circular fourth strip.

14. The cover element according to claim 12, wherein the first strips are in the form of annular lenses, each of which is superimposed to the annular transparent area of one of the sets comprising a circular fourth strip and an annular third strip.

15. The cover element according to claim 1, wherein said first layer is fastened on mobile supports and comprises moving means for translating said first layer longitudinal, laterally or transversal in relation to said second layer.

16. The cover element according to claim 15, wherein each of the first strips is displaceable in relation to the second layer independently from other first strips at least along one direction of displacement.

17. The cover element according to claim 15, wherein some or each of the first and second strips are displaceable relative to the third and fourth strips and relative to one another.

18. The cover element according to claim 17, wherein each of the third and fourth strips or at least a pair of one of the third strips and one of the fourth strips are displaceable relative to the first and second strips and relative to one another.

\* \* \* \* \*